United States Patent [19]
Watanabe et al.

[11] Patent Number: 5,370,738
[45] Date of Patent: Dec. 6, 1994

[54] COMPOUND SEMICONDUCTOR VAPOR PHASE EPITAXIAL DEVICE

[75] Inventors: Atsushi Watanabe, Tsurugashima; Hiroshi Amano, Nijigaoka-higashidanchi Room No. 19-103, No. 21, Kamioka-machi 2-chome, Meitou-ku, Nagoya-shi, Aichi-ken; Kazumasa Hiramatsu, Yokkaichi; Isamu Akasaki, No. 1-38-805, Jyoshin 1-chome, Nishi-ku, Nagoya-shi, Aichi-ken, all of Japan

[73] Assignees: Pioneer Electronic Corporation, Tokyo; Hiroshi Amano; Isamu Akasaki, both of Aichi, all of Japan

[21] Appl. No.: 12,780

[22] Filed: Feb. 3, 1993

[30] Foreign Application Priority Data

Mar. 6, 1992 [JP] Japan .................................. 4-049711

[51] Int. Cl.⁵ .................................................. C23C 16/00
[52] U.S. Cl. ...................................... 118/725; 118/715
[58] Field of Search ................ 118/715, 725; 156/613

[56] References Cited

U.S. PATENT DOCUMENTS

| | | | |
|---|---|---|---|
| 4,533,410 | 8/1985 | Ogura | 118/725 |
| 4,731,255 | 3/1988 | Maeda | 118/50.1 |
| 4,808,551 | 2/1989 | Mori | 156/613 |
| 5,070,814 | 12/1991 | Whiffin | 118/724 |
| 5,183,510 | 2/1993 | Kimura | 156/613 |
| 5,254,210 | 10/1993 | Jones | 118/715 |

FOREIGN PATENT DOCUMENTS

| | | | |
|---|---|---|---|
| 0282075 | 9/1988 | European Pat. Off. | 156/613 |
| 0505249 | 9/1992 | European Pat. Off. | |
| 2661554 | 10/1991 | France | |
| 61-186288 | 8/1986 | Japan | |
| 1-136971 | 5/1989 | Japan | 118/724 |
| 3-250623 | 11/1991 | Japan | 156/613 |
| 2220957 | 1/1990 | United Kingdom | |

*Primary Examiner*—Richard Bueker
*Attorney, Agent, or Firm*—Sughrue, Mion, Zinn, Macpeak & Seas

[57] ABSTRACT

A compound semiconductor vapor phase epitaxial device comprises a cylindrical reactor vessel, a plurality of flow channels disposed in the reactor vessel, a crystal substrate disposed in one of the flow channels, a plurality of gas supply pipes for respectively supplying gas containing element of compound to be grown on the crystal substrate and at least one slit or linearly arranged fine holes communicating adjacent two flow channels so as to extend in a direction normal to a direction of the gas flow to form a laminate layer flow consisting of two or more than two gases at an upstream portion of location of the crystal substrate.

12 Claims, 8 Drawing Sheets

F I G. 10
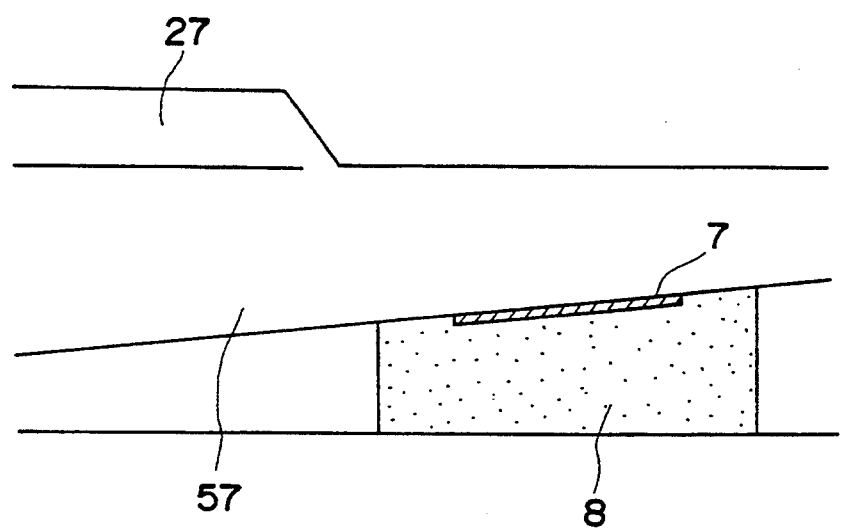

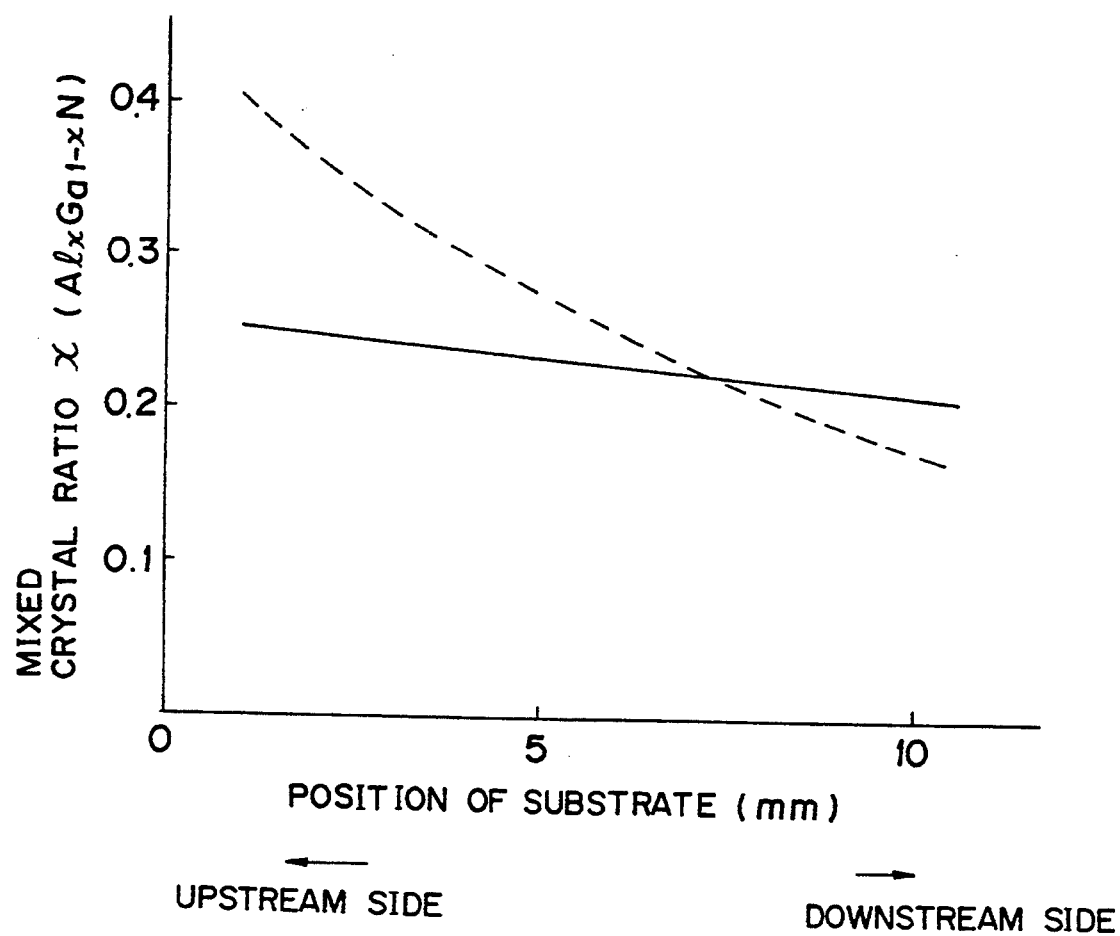

COMPOUND SEMICONDUCTOR VAPOR PHASE EPITAXIAL DEVICE

BACKGROUND OF THE INVENTION

This invention relates to a compound semiconductor vapor phase epitaxial device for improving uniformity in composition and reproducibility of a compound semiconductor crystal formed on a crystal substrate.

A metalorganic chemical vapor deposition, method is well known, which is a typical example of compound semiconductor vapor phase film formation methods capable of controlling thickness and composition of the film and, which is excellent in productivity, and thus, is widely utilized for the crystal growth of GaAs, which is, a typical compound semiconductor of the groups III-V elements.

In the MOCVD of the groups III-V elements compound semiconductor, the crystal growth is generally performed under an atmosphere in which the group V elements material is excessively supplied, and in such case, the crystal growth rate is in proportion to the supply amount of the group III elements material.

Further, nitride semiconductors such as GaN or AlGaN in the group III-V semiconductors are being studied as short wavelength light emitting elements, and experimental examples of the MOCVD utilizing, as materials, $NH_3$, TMG (trimethylgallium) or TMA(-trimethylaluminium) have been announced.

In a system, however, in which such materials are utilized, the $NH_3$ and the TMG, and the $NH_3$ and the TMA react respectively at room temperature (particularly, the $NH_3$ and the TMA are remarkably reacted), and accordingly, when the materials are supplied, these material are preliminarily mixed and the mixture is then guided into a reactor or reaction device. In such method, there are problems such that the composition of the film formed on the crystal substrate is not uniform and good reproducibility is not obtained. These problems are remarkably observed in the case of AlGaN mixed crystal.

In order to eliminate such problems, as disclosed in Japanese Patent Laid-open Publication No. 61-202422, the material gases are independently supplied to reaction areas, i.e. growth areas on the crystal substrate. However, it is difficult to uniformly grow the crystal on the crystal substrate only by independently supplying the material gases and mixing them in the reaction areas because of generation of vortices and turbulent flow in the gas flow. Furthermore, there is disclosed in Japanese Patent Laid-open Publication No. 61-186288 an angular reaction tube in consideration of the flow of the material gases. However, the above-mentioned problems cannot be solved by this angular reaction tube.

SUMMARY OF THE INVENTION

An object of this invention is to substantially eliminate the defects or drawbacks encountered in the prior art and to provide a compound semiconductor vapor phase epitaxial device capable of forming a crystal, on a crystal substrate, having a uniform composition and improved reproducibility.

Another object of this invention is to provide a compound semiconductor vapor phase epitaxial device provided with a plurality of gas flow channels through which material gases composed of $NH_3$ and TMG and TMA are respectively supplied to achieve the above object.

These and other objects can be achieved according to this invention by providing a compound semiconductor vapor phase epitaxial device comprising:

a cylindrical reactor vessel;

a plurality of flow channel means disposed in the reactor vessel;

a crystal substrate disposed in one of the flow channel means;

a plurality of gas supply means for respectively supplying gas containing element of a compound to be grown on the crystal substrate; and means for communicating adjacent flow channel means with each other so as to form a laminar layer flow consisting of two or more than two gases at an upstream portion of the location of the crystal substrate.

In a preferred embodiment, the flow channel means comprises first and second flow channels each having substantially a rectangular cross section with the first and second rectangular flow channels having a common wall structure through which the first and second flow channels are connected. The means for communicating the first and second flow channels is composed of at least one slit formed in the common wall structure and extending in a direction normal to the direction of the gas flow in the flow channel means. The slit may be replaced with a plurality of fine holes arranged linearly in a direction normal to the direction of the gas flow in the flow channel means.

In a further preferred embodiment, the crystal substrate is disposed in the first flow channel, the gas supply means includes first and second gas supply pipes and first and second gas supply sources, an excessive first gas is supplied in the first flow channel through the first gas supply pipe and a second gas for controlling the growth rate of a crystal to be grown on the crystal substrate is supplied in the second flow channel through the second gas supply pipe, and first gas flow rate is made larger than second gas flow rate.

The first gas includes an ammonium gas as a first material gas and the second gas includes trimethylgallium gas or a mixture gas of trimethylgallium gas and trimethyl-aluminum gas.

According to the structures and characters of the epitaxial device described above, a plurality of gas flow channel means are disposed in a reactor vessel to direct the flows of different kinds of material gases, which are mixed together in one of the flow channel means through communicating means at a portion just before the location of the crystal substrate. The communicating means is preferably formed as a slit extending in a direction normal to the gas flow direction. Accordingly, the gases passing the slit produce no turbulent gas flows, thus forming a crystal on the crystal substrate having uniform composition and improved reproducibility.

BRIEF DESCRIPTION OF THE DRAWINGS

For a better understanding of this invention and to show how the same is carried out, reference is made to, by way of preferred embodiments, the accompanying drawings, in which:

FIG. 10 shows a modification in which a taper is provided for a first flow channel; and FIG. 11 is a graph showing a positional dependence of the AlGaN alloy composition along the gas flow direction.

DESCRIPTION OF THE PREFERRED EMBODIMENTS

A first embodiment of a compound semiconductor vapor phase epitaxial device according to this invention will be first described hereunder with reference to FIGS. 1 to 5.

Figure 1:
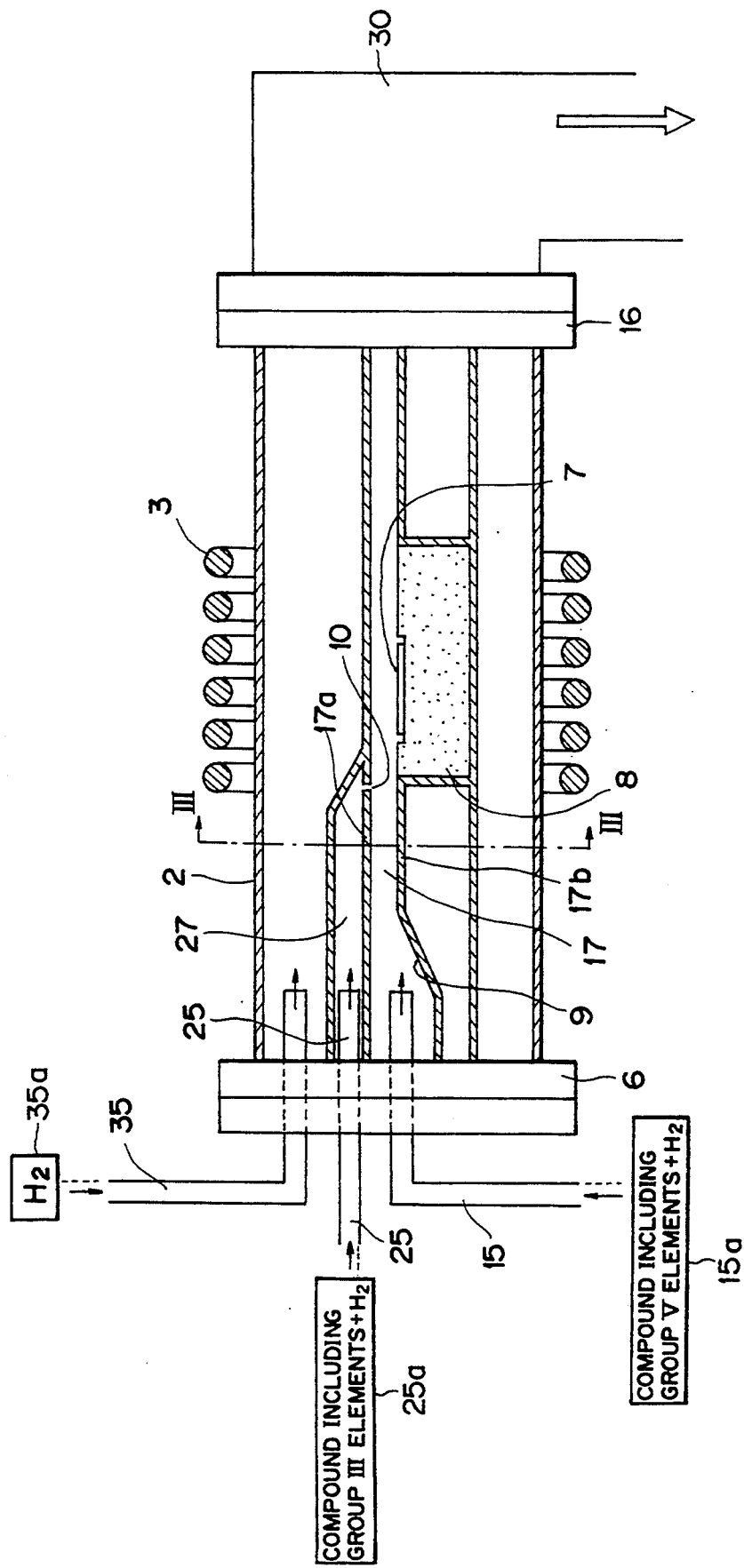
FIG. 1 is a front view, partially in section, of a compound semiconductor vapor phase epitaxial device according to this invention.

Referring to FIG. 1, a compound semiconductor vapor phase epitaxial device 1, called merely an epitaxial device 1 hereinafter, includes a cylindrical reactor vessel 2, first and second flow channels 17 and 27 both accommodated in the reactor vessel 2, and first and second material gas supply pipes 15 and 25 respectively communicated with the first and second flow channels 17 and 27. Both ends of the cylindrical reactor vessel 2 are closed by flanged portions 6 and 16 as end plates. These supply pipes 15 and 25 have first ends inserted into the reactor vessel 2 and communicated with the first and second flow channels 17 and 27, respectively, and have other ends extending outward through the flanged portion 6, and the extended ends of the gas supply pipes 15 and 25 are connected to material gas supply sources 15a and 25a. A hydrogen supply pipe 35 is further disposed so as to extend into the reactor vessel 2 through the flanged end 6 so as to supply hydrogen gas to outer peripheral areas of the flow channels 17 and 27. The hydrogen supply pipe 35 is connected to the hydrogen gas supply source 35a. To the other flanged end 16 is connected a discharge line 30.

In a preferred and illustrated embodiment, two flow channels are tightly secured at both longitudinal ends to the end plates 6 and 16 and supported thereby.

The reactor vessel 2 is formed, for example, of quartz material, and an RF coil 3 for heating a susceptor 8 is wound around the outer peripheral portion of the reactor vessel 2.

Figure 2:
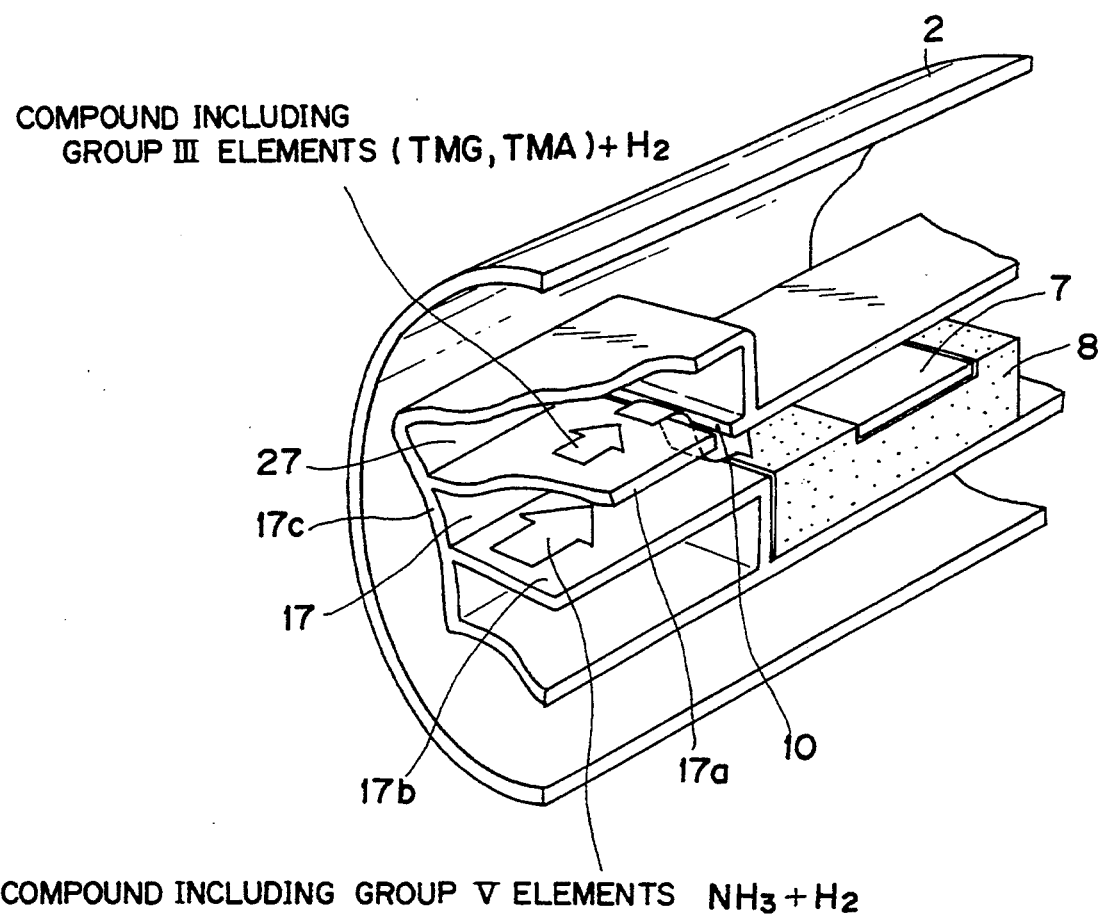
FIG. 2 is a schematic perspective view, partially broken away, of the epitaxial device of FIG. 1.
Figure 3:
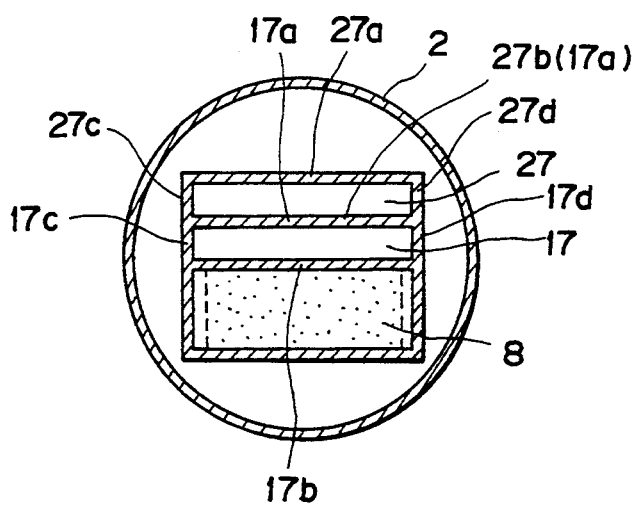
FIG. 3 is a sectional view taken along the line III—III in FIG. 1.
Figure 5:
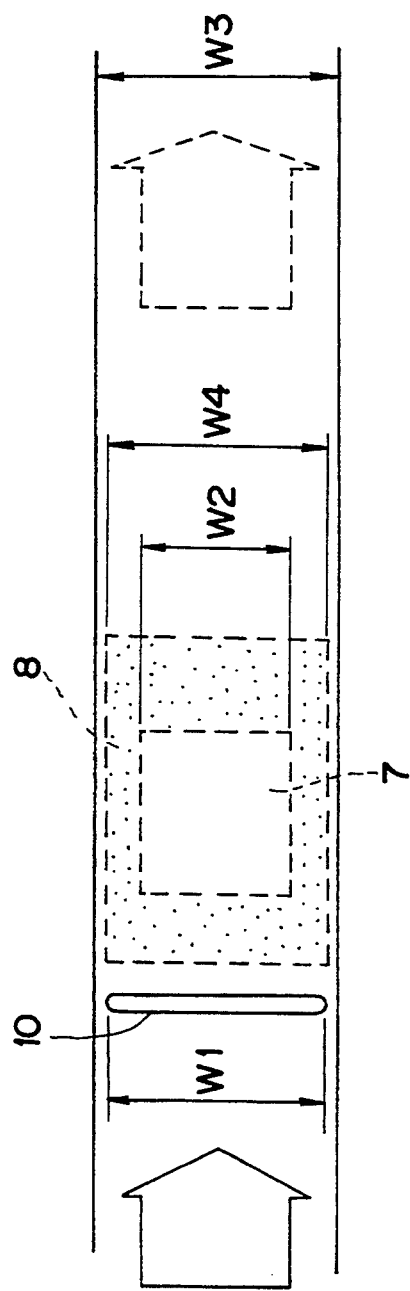
FIG. 5 is a schematic view showing positional relationship of various elements constituting the epitaxial device of FIG. 1.

As shown in FIGS. 2 and 3, the first flow channel 17 extends longitudinally in the reactor vessel 2 and has a rectangular cross section defined by four wall structures 17a, 17b, 17c and 17d. Referring to FIG. 1, the upper wall structure 17a forms a lower wall structure of the second flow channel means 27, and the upper wall structure 17a is provided with a slit 10 communicating the first and second flow channels 17 and 27 so that first and second material gases respectively flowing in the first and second channels 17 and 27 are mixed with each other. The slit 10 has a linearly elongaged hole shape, as shown in FIG. 2 or 5, extending in a direction normal to the gas flow in the channels 17 and 27 and has a length W1 larger than a width W2 of a crystal substrate 7, which is disposed on the lower wall structure 17b of the first channel 17 at substantially the inner central portion thereof. The crystal substrate 7 is supported by a graphite susceptor 8 which is disposed on the wall structure 17b. As shown in FIG. 2 or 3, the wall structure 17b has a hollow structure so as to provide a thickness necessary for locating the susceptor 8 on which the crystal substrate 7 is supported. The hollow structure is employed, for the purpose of reducing weight and cost, but it may be formed by a solid structure having the required thickness. In both cases, it desired that the surface of the crystal substrate 7 lie at substantially the same level as that of the lower wall structure 17b. The lower wall structure 17b has a ramp portion having an inclination for smoothly guiding the first material gas to the susceptor 8.

The second channel 27 is also defined by four wall structures 27a, 27b, 27c and 27d so as to provide a rectangular cross section and the second channel 27 is disposed above the first flow channel 17, in an installed or operating state, so that the wall structure 27b is commonly formed for the wall structure 17a of the first channel 17. The front end, i.e. right-hand end as viewed in FIG. 1, of the second flow channel 27 is closed so as to facilitate the gas flow into the first flow channel 17 through the slit 10. The first and second flow channels 17 and 27 have the same width W3 larger than the width W4 of the susceptor 8 as shown in FIG. 5. By setting the respective widths W1 to W4 as described above, the crystal can be grown stably with uniform composition in the width direction.

An excessive amount of the first gas is supplied into the first flow channel 17 and the second gas, which controls the growth rate of the crystal which is formed on the crystal substrate 7, is supplied into the second flow channel 27 positioned adjacent, i.e. above in the installed state, the first flow channel 17. The gas supply amounts and the cross sectional areas of the first and second flow channels 17 and 27 are determined so that the ratio of flow velocities, that is, flow velocity of the first gas with respect to flow velocity of the second gas, is within 5 to 200, preferably 10 to 100. When this ratio exceeds a value of 200, the switching speed of the second gas is delayed, which results in loss of sharpness of a hetero boundary when a hetero structure is formed and in increased consumption of the first gas. On the contrary, when the ratio is below a value of 5, the pressure in the reactor vessel may adversely increase or a turbulent flow may be caused at a portion near the communication portions, thus being also disadvantageous. The velocity of the first gas flow is generally ranges from 50 to 200 cm/sec.

In the case of a Group III-V compound semiconductor, particularly in the case of GaN or AlGaN, $NH_3$ gas as the first material gas and $H_2$ gas as a carrier gas are utilized as the first gas excessively supplied into the first flow channel 17, and TMG (trimethylgallium) or a mixed gas of TMG and TMA (trimethylaluminium) as the second material gas and $H_2$ gas as a carrier gas are utilized as the second gas supplied into the second flow channel 27.

On the other hand, in the case of Group II-VI compound semiconductor, particularly in the case of ZnS or ZnSe, $H_2S$ or $H_2Se$ is preferably utilized as the first material gas supplied into the first flow channel 17 and diethylzinc or dimethylzinc is preferably utilized as the second material gas supplied into the second flow channel 27.

The $H_2$ gas is supplied from the hydrogen supply source 35a into the reactor vessel 2 through the hydrogen supply pipe 35, and this $H_2$ gas performs a sealing function for preventing the material gases from leaking from the first and second flow channels 17 and 27, or it removes the leaking gases if they leak.

The function and operation of the epitaxial device 1 according to this invention described above will be described hereunder with reference to an example of an AlGaN compound semiconductor, in which $NH_3$ is the nitrogen N material of the group V elements and is supplied into the first flow channel 17 together with hydrogen $H_2$ as the carrier gas.

The mixed gas composed of TMG and TMA, being materials of the Group III elements, is also supplied into the second flow channel 27 together with the hydrogen $H_2$ gas. In such case, since it is desired that $NH_3$ be added in large excess, the ratio of concentration will be naturally determined as (TMG+TMA concentration) << ($NH_3$ concentration), and the flow rate which is determined in consideration of the carrier flow amount and the cross sectional areas of the flow channels, is set to the range in accordance with this invention as described hereinbefore to make the Gas flow rate V1 of the first gas sufficiently large.

Figure 4:
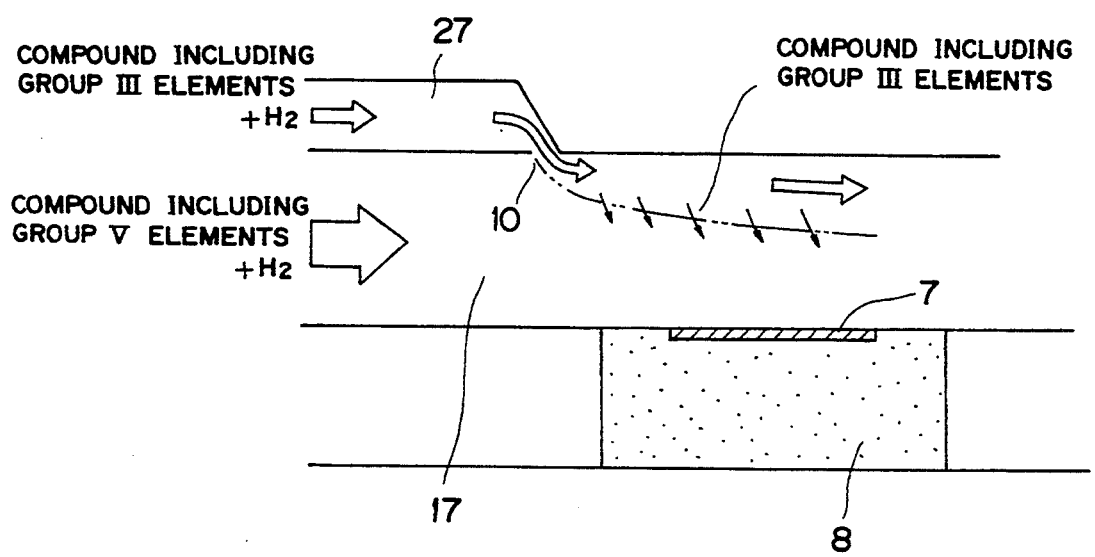
FIG. 4 is a view showing a dispersion of a gas of III group.

According to the conditions thus set or determined, the second gas flowing in the second channel 27 can pass the slit 10 formed in the wall section between the first and second channels 17 and 27 as if it were sucked by the first material gas flowing at high velocity in the first channel 17, and thus two-phase flow can be obtained without causing a turbulent flow. Namely, as shown in FIG. 4, by the provision of the slit 10, a laminar flow of the material gases, i.e. a laminar flow rich in the group III material on the side of the slit 10 and a laminar flow rich in the Group V material on the side of the crystal substrate 7 supported by the susceptor 8, is caused on the downstream, right-hand side. The group III gas flow gradually diffuses into the Group V gas flow and then reaches the reaction area at a temperature of more than about 1000° C. above the susceptor 8. The material is then decomposed and a crystal is hence Grown on the crystal substrate 7. As described, according to the epitaxial device 1 of this invention, a laminar gas flow of two or more than two material gases can be surely formed by suitably utilizing in combination various conditions such as concentrations of the material Gases, Gas flow rate, etc.

Alterations or modifications of the epitaxial device according to this invention will be described hereunder with reference to FIGS. 6 to 10.

Figure 6:
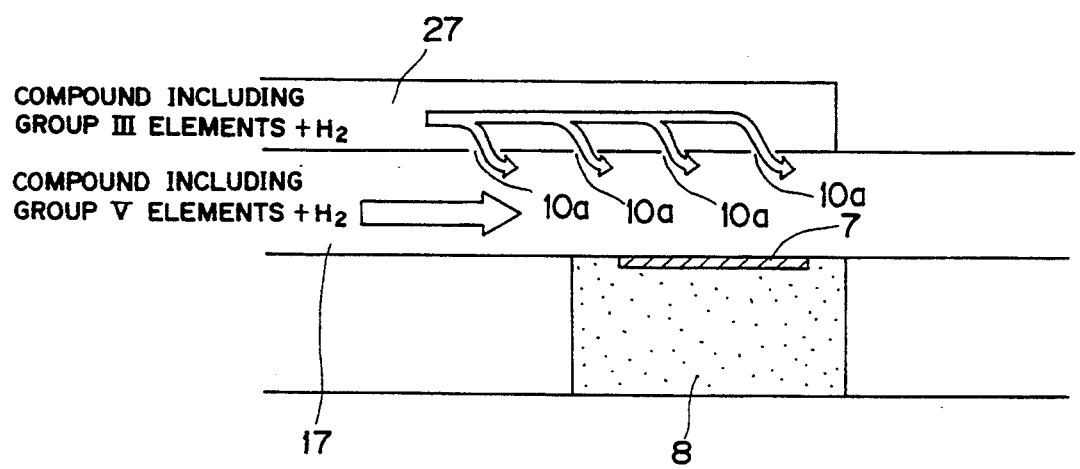
FIG. 6 is a schematic front view of a modification having a plurality of slits utilized for the device of this invention.

FIG. 6 shows a modification in which a plurality of slits 10a are formed, in place of the single slit 10 of FIG. 4, in the wall structure defining the first and second flow channels 17 and 27, and in the illustrated example, four slits 10a are formed extending in a direction normal to the flow direction of the Gases. The number of the slits 10a may be determined in consideration of the size of the crystal substrate 7, the working accuracy of the slits 10a and the like.

Figure 7:
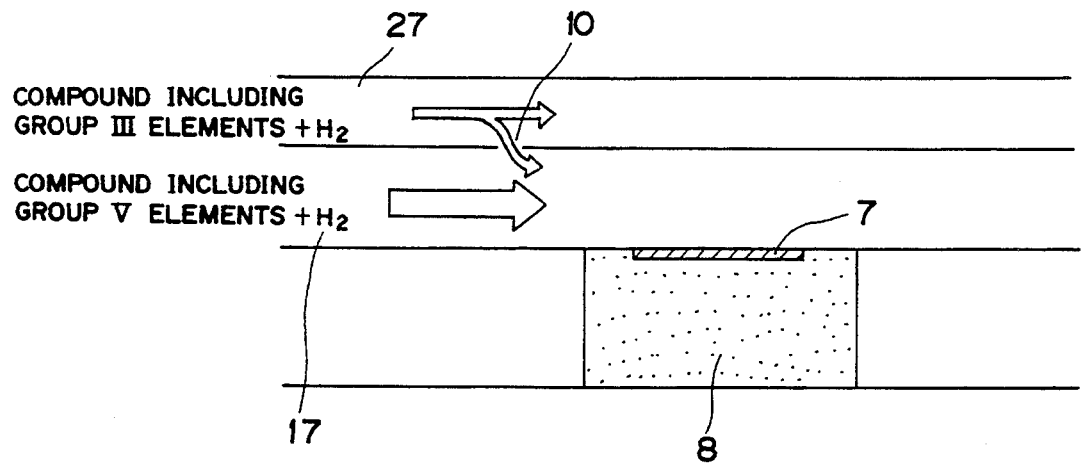
FIGS. 7 and 8 are schematic front views of further modifications in relation to FIG. 6.

FIG. 7 shows an alteration in which the downstream end side of the second flow channel 27 is opened, and in this case, a portion of the material Gas flowing in the second flow channel 27 flows downward and into the first flow channel 17 through the slit 10, thus forming the two-phase flow without causing any turbulent flow.

Figure 8:
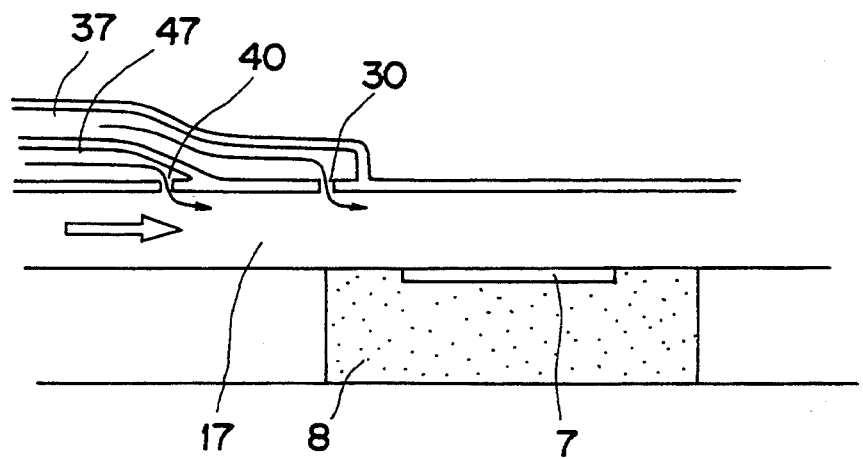

FIG. 8 shows another modification of this invention, in which the second flow channel is divided further into two flow channels 37 and 47, in which slits 30 and 40, each similar to the slit 10, are formed, so as to communicate with the first flow channel 17. In this case, when it is desired to prepare a Group III-V AlGaN compound semiconductor, the Group III TMG and TMA can be separately fed to the reaction areas through the channels 37 and 47, respectively.

Figure 9A:
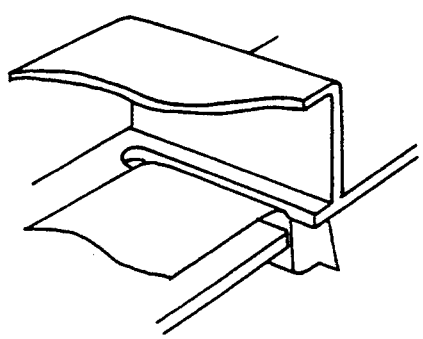
FIG. 9A is an enlarged perspective view showing a slit in one preferred embodiment.
Figure 9B:
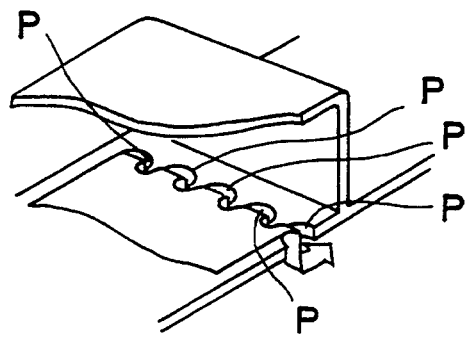
FIG. 9B shows a modification of FIG. 9A, in which the slit is replaced with a plurality of fine holes.

FIG. 9B depicts a further modification of the first embodiment, in which the slit 10 of the first embodiment (FIG. 9A) is replaced with a plurality of fine holes P extending linearly in a direction normal to the flow direction of the gas.

FIG. 10 shows an alteration of the first embodiment, in which the first flow channel 57 has, in an installed state or illustrated state, a lower wall structure which is tapered so as to incline upwardly towards the downstream side of the gas flow to thereby narrow the flow passage of the first channel. According to this embodiment, the composition of the compound semiconductor can be preferably adjusted uniformly.

An actual experiment utilizing the compound semiconductor vapor phase epitaxial device according to this invention shown in FIG. 1 was performed in the following manner.

The crystal substrate was first set at a predetermined position in the reactor vessel of the epitaxial device, and thereafter, air in the reactor vessel was vacuum exhausted by means of a rotary vacuum pump, for example, through the discharge line 30 connected to the downstream side of the reactor vessel. In the next step, the $NH_3$ material gas and the $H_2$ carrier gas were supplied into the first flow channel 17 and the TMG and TMA material gases and the $H_2$ carrier gas were supplied into the second flow channel 27. The average flow rate of the gas ($NH_3+H_2$) passing the first channel 17 was set to 110 cm/sec. and the average flow rate of the gas (TMG+TMA+$H_2$) was set to 5.0 cm/sec. The temperature of the crystal substrate of 1050° C. was maintained by heating the susceptor 8 by means of the RF coil 3 for one hour to thereby epitaxially grow an AlGaN series compound semiconductor. The positional dependence of the AlGaN alloy composition along the gas flow direction was measured.

The measured result is shown in FIG. 11, in which the solid line represents the distribution of the experiment according to this invention. For the sake of comparison, the distribution of a mixed crystal ratio according to a prior art device in which no flow channel is utilized, a so called normal pressure type MOCVD device, is also in FIG. 11 by a dotted line. As can be easily seen from the result of FIG. 11, according to the epitaxial device of this invention, the composition of the film-formed crystal formed on the crystal substrate can be made substantially uniform and the reproducibility can be also improved.

What is claimed is:

1. A compound semiconductor vapor phase epitaxial device comprising:
   a cylindrical reactor vessel;
   first and second adjacent flow channels disposed in the reactor vessel, said first and second flow channels each having substantially a rectangular cross section and said first and second flow channels having a common wall structure, at least one aperture being formed in said common wall structure extending in a direction normal to a direction of gas flows in said flow channels;

a crystal substrate disposed in one of the flow channel means; and a plurality of gas supply means for respective gases containing elements of compounds to be grown on the crystal substrate; wherein said at least one aperture communicates the adjacent first and second flow channels with each other so as to form a laminar flow of the gases flowing in said channels at a location upstream of the crystal substrate.

2. An epitaxial device according to claim 1, wherein said at least one aperture communicating the first and second flow channels is at least one slit formed in the common wall structure.

3. An epitaxial device according to claim 1, wherein said at least one aperture communicating the first and second flow channels is a plurality of slits formed in the common wall structure.

4. An epitaxial device according to claim 1, wherein said at least one aperture communicating the first and second flow channels is a plurality of fine holes arranged in a pattern extending linearly in a direction normal to the direction of the gas flows in the flow channels.

5. An epitaxial device according to claim 1, wherein said crystal substrate is disposed in the first flow channel, and further comprising gas supply means comprising first and second gas supply pipe means and first and second gas supply sources, an excessive first gas being supplied in the first flow channel through the first gas supply pipe means and a second gas for controlling growth rate of a crystal to be grown on the crystal substrate being supplied in the second flow channel through the second gas supply pipe means, and wherein a flow rate of the first gas is made larger than the flow rate of the second gas.

6. An epitaxial device according to claim 5, wherein a ratio of the flow rate of the first gas in the first flow channel with respect to the flow rate of the second gas in the second flow channel is within a range of 5 to 200.

7. An epitaxial device according to claim 6, wherein the ratio is within a range of 10 to 100.

8. An epitaxial device according to claim 5, wherein said second flow channel is closed at a downstream distal end portion thereof with respect to the gas flow.

9. An epitaxial device according to claim 5, wherein said first gas includes ammonium gas as a first material gas and said second gas includes a trimethylgallium gas or mixture gas of trimethylgallium gas and trimethylaluminium gas.

10. An epitaxial device according to claim 5, wherein said first flow channel has a bottom wall structure on which said crystal substrate is disposed, said bottom wall structure being tapered toward the downstream side of the gas flow so as to reduce a cross sectional area of said first flow channel.

11. An epitaxial device according to claim 10, wherein said at least one aperture is a plurality of slits formed in the common wall structure extending in a direction normal to a direction of gas flows in said channels.

12. An epitaxial device according to claim 5, further comprising a susceptor for supporting said crystal substrate, and coil means disposed around an outer peripheral surface of the reactor vessel.

* * * * *